(12) United States Patent
Kantor et al.

(10) Patent No.: US 6,819,789 B1
(45) Date of Patent: Nov. 16, 2004

(54) SCALING AND REGISTRATION CALIBRATION ESPECIALLY IN PRINTED CIRCUIT BOARD FABRICATION

(75) Inventors: Zeev Kantor, Gan-Yavne (IL); Amnon Ganot, Petach Tikva (IL)

(73) Assignee: Orbotech Ltd., Yavne (IL)

(*) Notice: Subject to any disclaimer, the term of this patent is extended or adjusted under 35 U.S.C. 154(b) by 0 days.

(21) Appl. No.: 09/708,160

(22) Filed: Nov. 8, 2000

(51) Int. Cl.[7] .................................................. G06K 9/00
(52) U.S. Cl. ...................... 382/151; 702/95; 250/559.3
(58) Field of Search .............................. 382/151, 284, 382/147; 358/1.18, 1.12, 488; 219/121.8; 427/96; 174/257; 348/87, 126; 356/237.4, 237.5; 702/94, 95, 150, 151, 152, 153; 250/559.3, 559.37

(56) References Cited

U.S. PATENT DOCUMENTS

| | | | |
|---|---|---|---|
| 4,566,038 A | 1/1986 | Dimick | 358/256 |
| 4,680,627 A | 7/1987 | Sase et al. | 358/101 |
| 4,894,790 A | 1/1990 | Yotsuya et al. | 364/552 |
| 5,156,772 A | 10/1992 | Allan et al. | 252/514 |
| 5,161,202 A | 11/1992 | Kitakado et al. | 382/8 |
| 5,388,517 A | 2/1995 | Levien | 101/485 |
| 5,548,372 A | 8/1996 | Schroeder et al. | 355/53 |
| 5,643,699 A | 7/1997 | Waldner | 430/22 |
| 5,768,443 A * | 6/1998 | Michael et al. | 382/294 |
| 5,856,844 A * | 1/1999 | Batterman et al. | 348/207 |
| 5,980,088 A * | 11/1999 | Iwasaki et al. | 364/474.08 |
| 6,064,757 A | 5/2000 | Beaty et al. | 382/147 |
| 6,165,658 A | 12/2000 | Taff et al. | 430/30 |
| 6,205,364 B1 * | 3/2001 | Lichtenstein et al. | 700/58 |
| 6,246,789 B1 | 6/2001 | Hosotani et al. | 382/151 |
| 6,449,516 B1 * | 9/2002 | Kyomasu et al. | 700/58 |
| 6,567,713 B2 | 5/2003 | Lichtenstein et al. | 700/58 |
| 2002/0015165 A1 | 2/2002 | Taka et al. | 358/69 |

FOREIGN PATENT DOCUMENTS

| | | |
|---|---|---|
| CN | 247392 | 5/1995 |
| GB | 2 288 229 | 10/1995 |
| WO | WO 00/02424 A1 | 1/2000 |

OTHER PUBLICATIONS

IBM Technical Disclosure Bulletin, NN950689, Product Alignment Method for Probing Systems, 3 pages, Jun. 1, 1995.*

Brochure from the BARCO corporation, titled Gemini Laser Direct Imaging, a Profitable Reality for Your Shop, copyright 2000.*

* cited by examiner

*Primary Examiner*—Brian Werner
(74) *Attorney, Agent, or Firm*—Sughrue Mion, PLLC

(57) ABSTRACT

A method is disclosed for calibrating a camera used in a scanner for scanning images onto a printed circuit board. The calibration method determines a transformation between the camera and the scanner by writing a pattern on a photosensitized substrate using the scanner, where the pattern is visible without development, and using the camera to image the pattern, from which a transformation between the imager and scanner coordinate systems is determined.

37 Claims, 10 Drawing Sheets

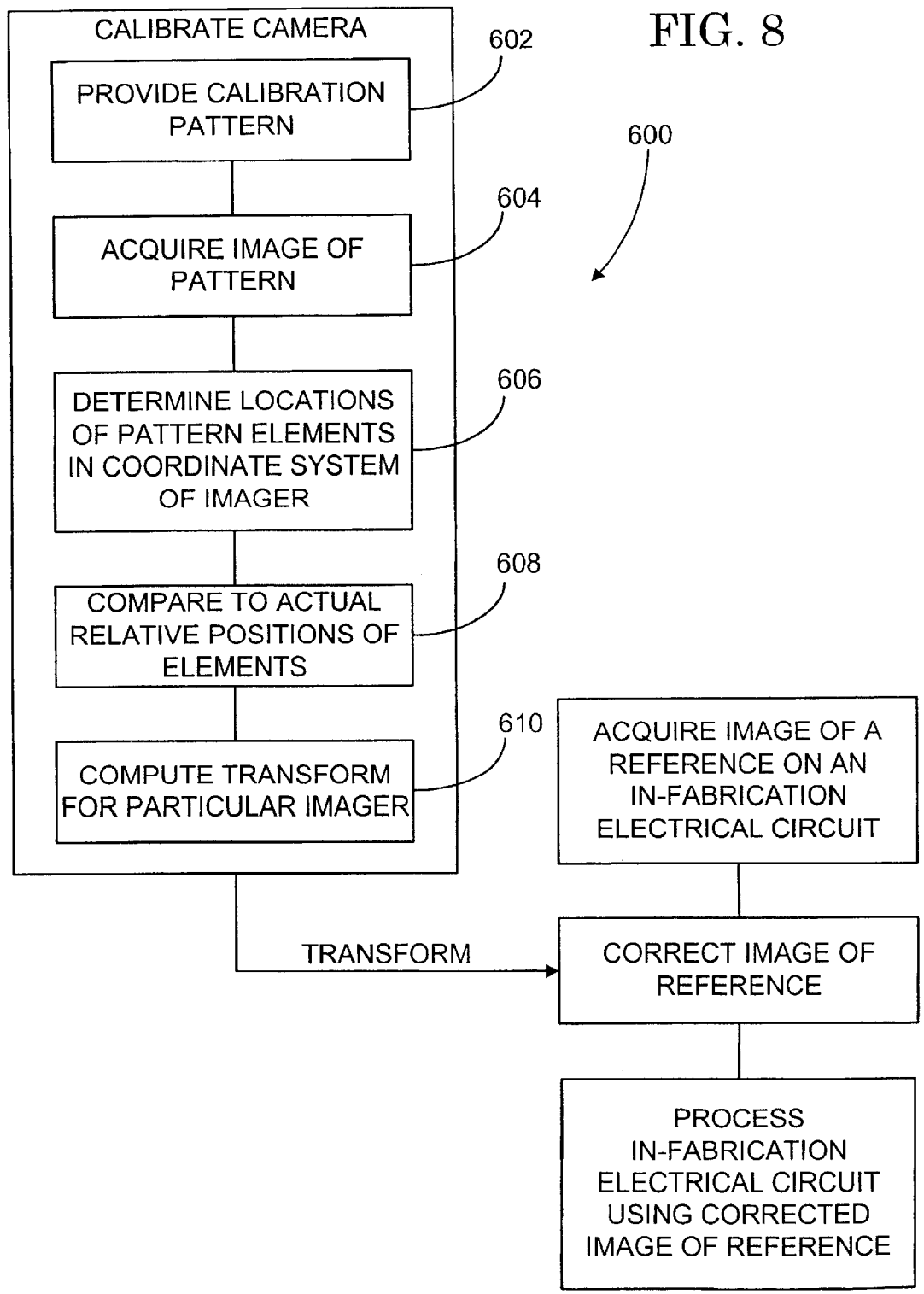

SCALING AND REGISTRATION CALIBRATION ESPECIALLY IN PRINTED CIRCUIT BOARD FABRICATION

FIELD OF THE INVENTION

The present invention is related to the field of electrical circuit fabrication and especially to the field of printed circuit board fabrication employing a laser direct imaging device.

BACKGROUND OF THE INVENTION

PCT patent publication WO 00/02424, the disclosure of which is incorporated herein by reference, describes a scanning laser direct imaging (LDI) system for writing an electric circuit pattern on a printed circuit board substrate.

FIG. 1 is a reproduction of FIG. 1 of the above referenced publication. Some details of its operation are given below. Further details of the operation and an explanation of the figure can be found in the publication. In such systems, a laser beam or beams, modulated with pattern data, is scanned across a sensitized printed circuit board substrate 78 to write a latent image of a desired electrical circuit pattern.

The substrate is optionally inverted and a second pattern in side to side alignment with the first pattern is written on the other side of the substrate. In accordance with some printed circuit board fabrication techniques, substrate layers may be sequentially laminated to previously produced substrate layers and an electrical circuit pattern is written on the outermost side of each sequentially added layer in a build up fashion. The latent patterns are developed to form etching masks on the substrate. The masked substrate is etched to form the desired electrical circuit pattern.

Among the problems which arise in printed circuit board fabrication is the side to side alignment of printed circuit patterns on various substrate layers, and mutual alignment among patterns printed on various substrate layers. One method utilized to obtain suitable alignment is disclosed in the embodiment of FIGS. 1, 2, 14, 15 and 16, of the publication (FIG. 2 is a reproduction of FIG. 14 of the above referenced publication.). PC board substrate 78 is formed with a plurality of holes 150 at least some of which are preferably aligned, at least roughly, in the scan direction. A base on which the substrate is mounted is formed with openings larger than the holes in the substrate and the holes in the substrate are positioned generally in correspondence to the openings in the base. One or more detectors 152 are positioned below the scan line of the scanner.

As the printed circuit board is transported past the scan line, the scanner scans across the holes in a substrate layer. Based on signals detected by detector 150 via the holes and the openings, the locations of the holes in the substrate layer with respect to the scanner are detected. The base is optionally rotated and scanning of the printed circuit board substrate then commences with the position of the scanning lines pattern being referenced to the location of the holes.

It should be noted that the position of the scanning beam that passes through holes 150 is scanned together with another beam that impinges a scale 80 that is used to determine the true instantaneous (scan dimension) position of the beam in the scan direction. Furthermore, the relative cross-scan position of the holes (and thus the board) is determined utilizing a second scale, typically operatively associated with the base.

When scanning the second side of the substrate, the procedure is repeated to determine the position of the holes and thus the position of the already scanned pattern on the first side of the substrate (or the position of already scanned patterns on lower layers in a build up board) with respect to the coordinate space of the LDI system. This allows for the data in the scanning of each subsequent side to be aligned with respect to previously scanned sides.

Optionally, an additional series of holes in the board and pins on the base, or a guide rail along the base, may be used for rough alignment of the substrate. Such pins are shown in FIG. 16 of the reference. In some conventional systems, only such mechanical means are used for aligning the patterns on the two sides of the substrate. The system may include means for rotating the board to improve alignment.

Measuring systems employing imagers, and especially CCD cameras, are known in the art for use in determining the positioning of a PC board in an LDI scanner. Generally, such cameras may be used to detect various markings on a printed circuit board laminate layer, or to detect an edge of a printed circuit board laminate layer and to relate the detected position of the marking or the edge with a scanner position.

SUMMARY OF THE INVENTION

An aspect of some embodiments of the invention is concerned with methods of calibrating the relationship between the coordinate space of a measuring system, for example, an imager and the coordinate space of an LDI scanner.

In some embodiments of the invention, a mark or a plurality of marks is written on light sensitive media by a scanner. The positions of the marks written by the scanner are used as a reference for calibration between the coordinate space of a measurement system and a coordinate space of the scanner. The substrate is then moved, in a controlled manner, to another location, at which the marks can be viewed by the measurement system, typically a camera. The positional relation in locations of the marks as written by scanner and measured by the measurement system, allows for correlation of the position of a mark in coordinate space of the measurement system to the position of the mark in coordinate space of the scanner.

In exemplary embodiments of the invention, the sensitized media is of a type which shows a visible change when exposed to the light used to scan a pattern on the board. This allows for the image of a mark written by the scanner to be visualized by an imager without development and without removing the substrate from the scanner.

Optionally, the marks written by the scanner in a calibration mode are 2-dimensional, and thus enable calibration and coordination of the field of view of the imager to the pixel grid of the scanner. An aspect of some embodiments of the invention is concerned with the calibration of the field of view of an imager, such as a camera, especially one used in a scanner for imaging patterns on printed circuit boards.

In many embodiments of the invention, the imager images patterns which may be extended in one or both X-Y dimensions and/or images having a number of features and/or a feature or features that are not centered on the field of view (FOV) of the imager. Due, inter alia, to distortions in the optics of the imager (which in an exemplary embodiment of the invention, is a camera, such as a CCD camera) and imprecise magnification, the physical location of a feature being imaged does not correspond to the coordinates of the feature on the image.

In some embodiments of the invention, the camera field of view is calibrated to correlate the pixel size and/or angular orientation of pixels in the camera to pixels in the scanner system.

An aspect of some embodiments of the invention is concerned with using an imager, such as a CCD camera, to determine the position of a printed circuit board substrate in a scanner.

In some embodiments of the invention, a plurality of stationary cameras or other imagers are used to perform the imaging function. In other embodiments a single stationary camera is used to image a plurality of features or a two dimensional feature (such as a corner) so that both position and angle of the substrate may be determined. In some embodiments of the invention, the one or more imagers (for example CCD cameras) are mounted on a rail or other accurate mechanism that allows movement of the camera in one dimension (generally in the scan direction, perpendicular to the movement of the substrate during writing). Movement along the rail may be measured accurately using an encoder, for example. Alternatively or additionally, the mechanism may be provided with precision "detents" or other fixed position determining mechanisms. In such systems, the imager position is limited to one or a few positions.

There is thus provided, in accordance with an exemplary embodiment of the invention a method of calibrating a camera used in a scanner for scanning images onto printed circuit board substrates, the method comprising:

(a) writing a pattern on a sensitized substrate using the scanner, wherein the pattern is visible without development;

(b) imaging the pattern with at least one imager; and (c) determining a transformation between an imager referenced coordinate system and a scanner referenced coordinate system.

In an embodiment of the invention, the method includes moving the pattern between (a) and (b) without removing the substrate from the scanner. Optionally, the method includes measuring the amount of said movement and utilizing said measurement in said determination of a transformation.

In some embodiments of the invention, the at least one imager comprises a single imager. Alternatively, the at least one imager comprises a plurality of imagers.

In some embodiments of the invention, the at least one imager is fixed in position. Alternatively, the at least one imager is moveable, and including a measurement assembly for determining the position of the at least one imager.

Optionally, the pattern comprises a two dimensional pattern and including calibrating the field of view of the imager based on an image of the pattern acquired by the imager. Optionally, calibrating includes adjusting the spatial orientation of the imager with respect to the scanner. Alternatively or additionally, calibrating includes compensating for differences in magnification at various parts of the field of view of the imager. Alternatively or additionally, calibrating includes compensating for distortion in the field of view of the imager.

Optionally, determining a transformation includes determining coordinates of the pattern in imager space.

There is further provided, in accordance with another exemplary embodiment of the invention, a method of calibrating a field of view of a camera used in a scanner for scanning images onto printed circuit board substrates, the method comprising:

(a) writing a pattern on a sensitized substrate using the scanner, wherein the pattern is visible to the camera without development;

(b) imaging the pattern with the camera; and (c) determining correction factors for locations in the camera field of view Optionally, the pattern comprises a two dimensional pattern.

Optionally, calibrating includes adjusting the spatial orientation of the imager with respect to the scanner. Alternatively or additionally, calibrating includes compensating for differences in magnification at various parts of the field of view of the imager. Alternatively or additionally, calibrating includes compensating for distortion in the field of view of the imager.

There is further provided, in accordance with a preferred embodiment of the invention, a method of correcting a calibration of an imager used in a scanner for scanning images onto printed circuit board substrates, the method comprising;

(a) determining a transformation between an imager coordinate system and a scanner coordinate system;

(b) providing an element whose location can be separately determined utilizing the scanner beam and the imager;

(c) determining the location of the element in the imager coordinate system;

(d) transforming the location determined in (c) into the scanner coordinate system utilizing the transformation;

(e) determining an equivalent location of the element in the scanner coordinate system utilizing the scanner beam; and (f) correcting the transformation based on a difference between the locations determined in (c) and (e).

In an embodiment of the invention, the method includes moving the pattern between (c) and (e) without removing the substrate from the scanner. Optionally, the method includes measuring the amount of said movement and utilizing said measurement in said determination of the equivalent location.

There is further provided, in accordance with an exemplary embodiment of the invention, a method of calibrating a camera used in a scanner for scanning images onto printed circuit board substrates, the method comprising:

(a) providing a pattern on a substrate;

(b) determining the coordinates of the pattern in a scanner coordinate system;

(c) imaging the pattern with at least one imager; and (d) determining a transformation between an imager referenced coordinate system and a scanner referenced coordinate system.

In an embodiment of the invention, the method includes moving the pattern between (a) and (c) without removing the substrate from the scanner. Optionally, the method includes measuring the amount of said movement and utilizing said measurement in said determination of a transformation.

In some embodiments of the invention, the at least one imager comprises a single imager. Alternatively, the at least one imager comprises a plurality of imagers.

In some embodiments of the invention, the at least one imager is fixed in position. Alternatively, the at least one imager is moveable, and including a measurement assembly for determining the position of the at least one imager.

Optionally, the pattern comprises a two dimensional pattern and including calibrating the field of view of the imager based on an image of the pattern acquired by the imager. Optionally, calibrating includes adjusting the spatial orientation of the imager with respect to the scanner. Alternatively or additionally, calibrating includes compensating for differences in magnification at various parts of the field of view of the imager. Alternatively or additionally, calibrating includes compensating for distortion in the field of view of the imager.

Optionally, determining a transformation includes determining coordinates of the pattern in imager space.

In an embodiment of the invention, determining the coordinates of the pattern in a scanner coordinate system comprises:

scanning the hole pattern with the scanner; and determining the positions of the holes as they pass the scanner.

There is further provided, in accordance with an embodiment of the invention, a method of calibrating a field of view of a camera used in a scanner for scanning images onto printed circuit board substrates, the method comprising:

(a) providing a pattern of holes;

(b) imaging the pattern with the camera; and (c) determining correction factors for locations in the camera field of view Optionally, the pattern comprises a two dimensional pattern. Optionally, calibrating includes adjusting the spatial orientation of the imager with respect to the scanner. Optionally, calibrating includes compensating for differences in magnification at various parts of the field of view of the imager. Optionally, calibrating includes compensating for distortion in the field of view of the imager.

There is further provided, in accordance with an exemplary embodiment of the invention, a method of correcting alignment between a scanner portion of a direct writing scanner and an imager thereof, the method comprising:

(a) providing a transformation between a scanner coordinate system and an imager coordinate system;

(b) providing an object whose location is measurable in both the scanner coordinate system and in the imager coordinate system;

(c) measuring the location of the object in the scanner coordinate system;

(d) measuring the location of the object in the imager coordinate system; and (e) correcting the transformation based on the measured locations in the two coordinate systems.

Optionally, correcting comprises:

transforming the measured location in a first one of the coordinate systems to the other coordinate system;

determining a difference between the location of the object as measured in the other coordinate system and the location of the object measured in the first coordinate system and transformed into the other coordinate system; and correcting the transformation responsive to said difference.

Optionally, the object is a circularly symmetrical object.

Exemplary embodiments of the invention is described in the following sections with reference to the drawings. The figures are generally not to scale and the same or similar reference numbers are used for the same or related features on different drawings.

BRIEF DESCRIPTION OF THE DRAWINGS

FIG. 8 is a simplified flow diagram of a method of computing position corrections in the field of view of an imager, such as a camera, used in scanner, in accordance with an embodiment of the invention.

DETAILED DESCRIPTION OF EXEMPLARY EMBODIMENTS

Figure 3:
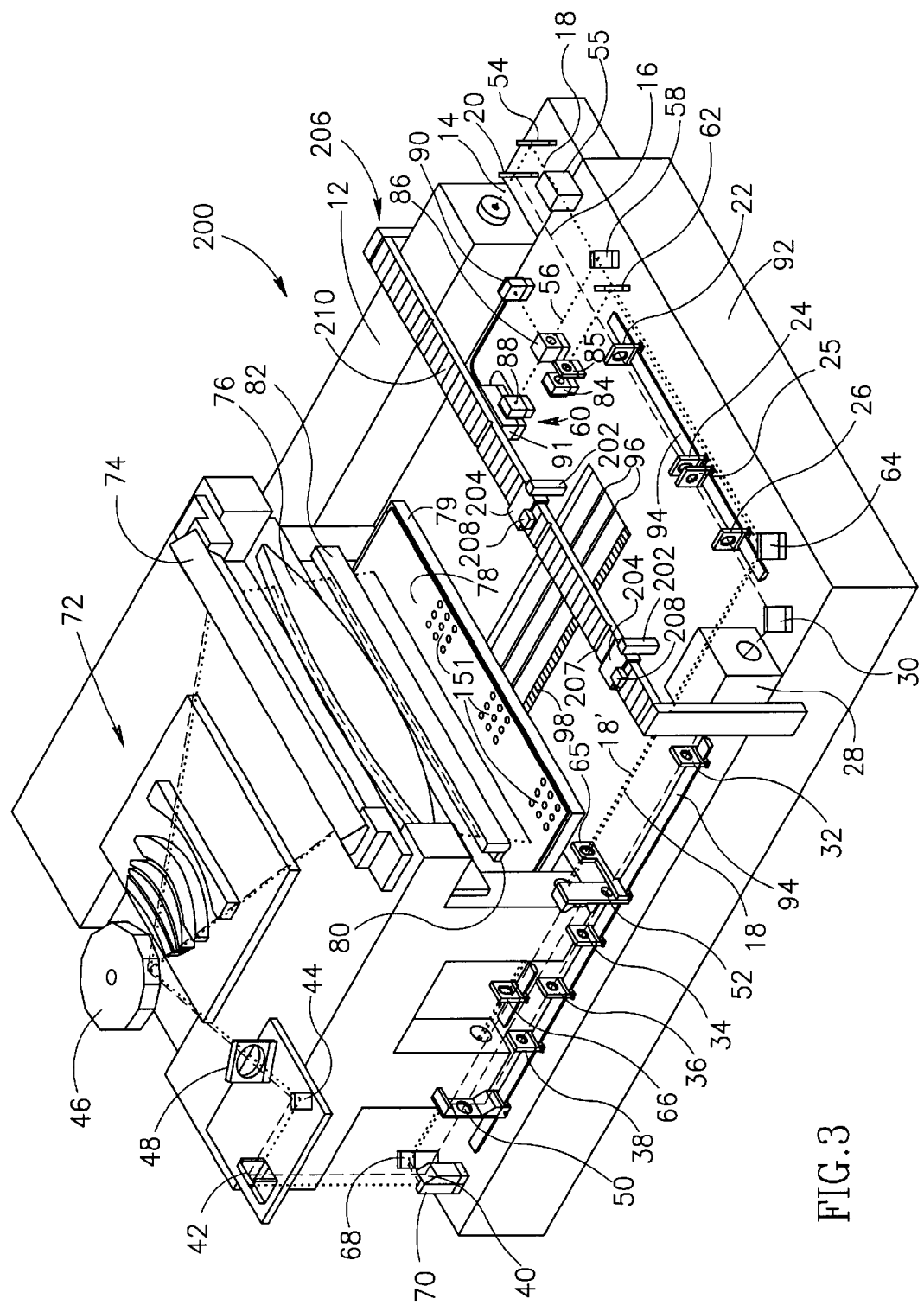
FIG. 3 shows a perspective drawing of a scanner in accordance with an embodiment of the invention.
Figure 4:
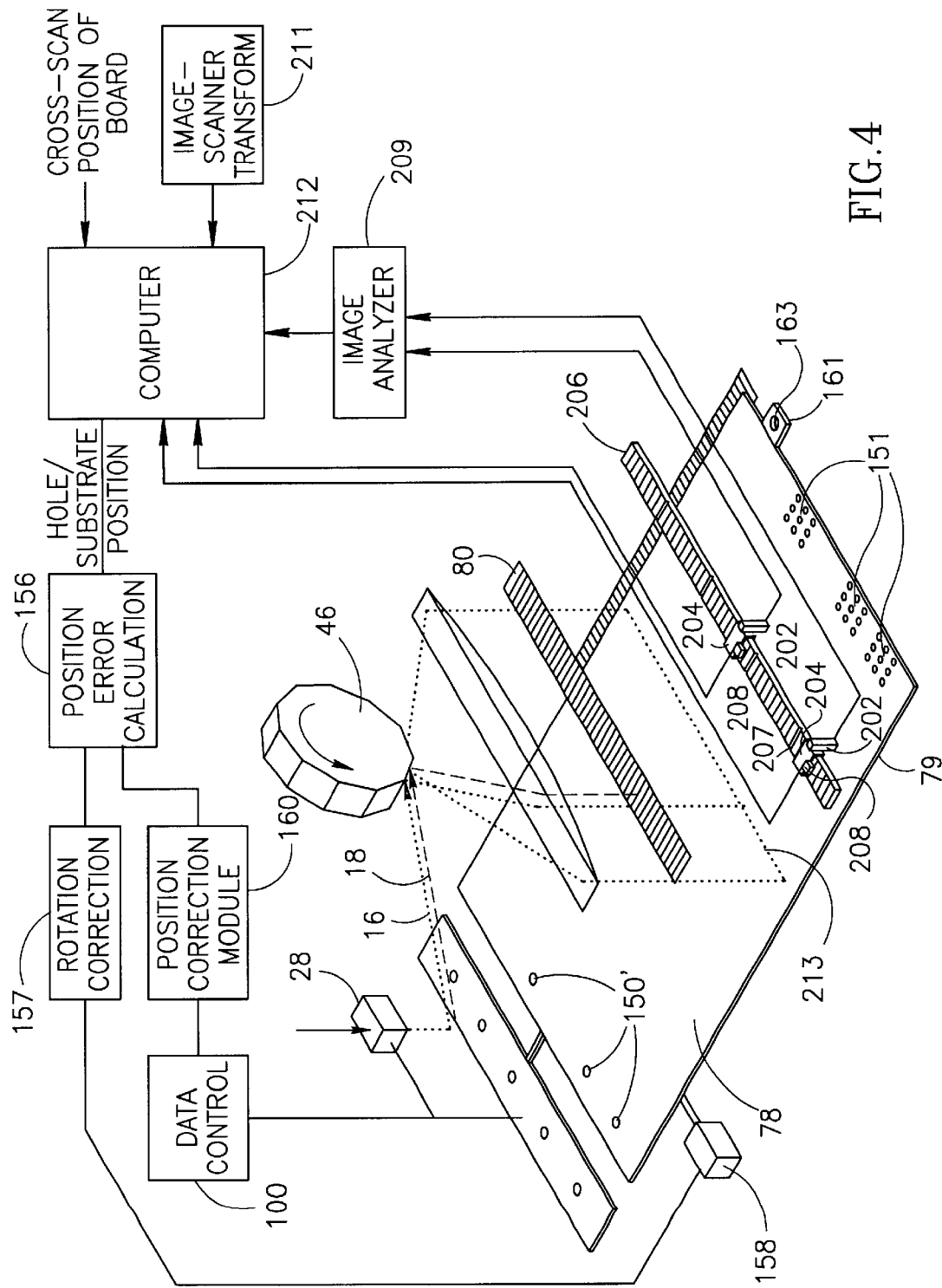
FIG. 4 shows a perspective drawing of a portion of the scanner of FIG. 3, related to the determination of printed circuit board position in accordance with an embodiment of the invention.

FIGS. 3 and 4 show an embodiment 200 of the present invention, which includes apparatus enabling the use of a new method of determining the relative position of the printed circuit board in the scanner.

Figure 1:
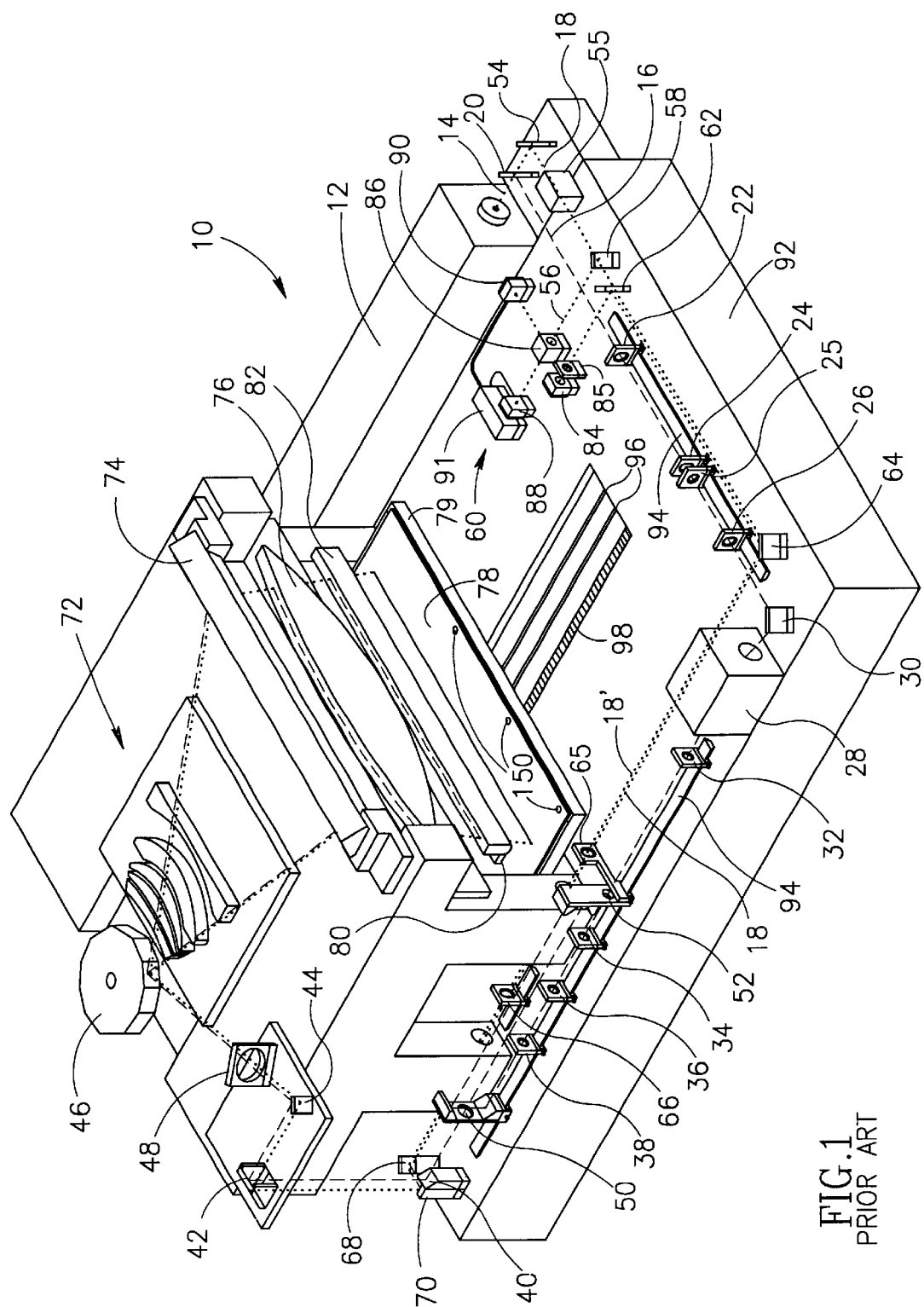
FIG. 1 shows a perspective drawing of a scanner, in accordance with the prior art.
Figure 2:
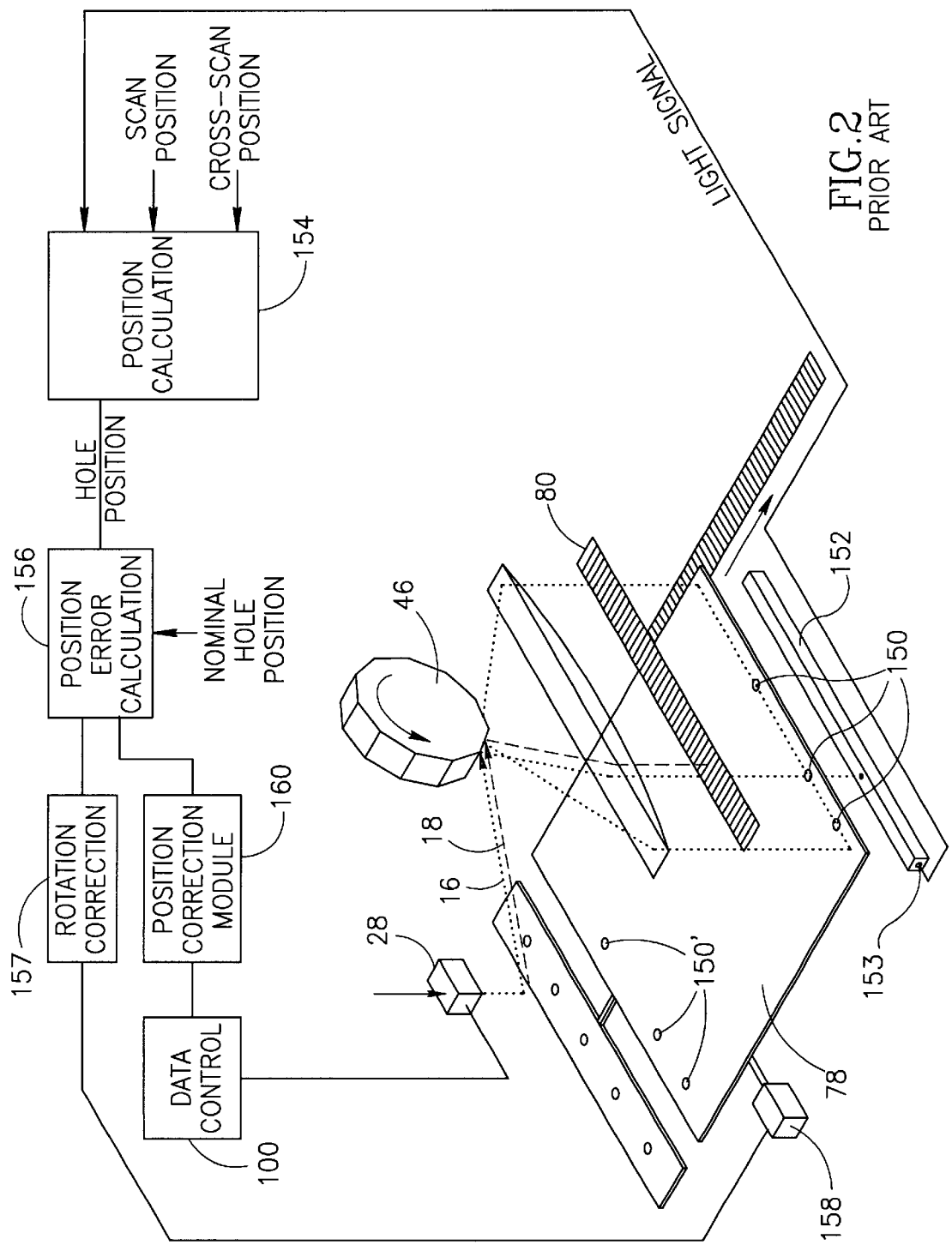
FIG. 2 shows a perspective drawing of a portion of the scanner of FIG. 1, related to the determination of printed circuit board position in accordance with the prior art.

In this system, the main change from the prior art system of FIGS. 1 and 2 is in the system for determining a reference for the scanner for writing an electrical circuit pattern.

As shown in FIG. 3, the system includes two downward facing imagers 202, such as CCD cameras, mounted on a base 204. In the exemplary embodiment shown, bases 204 are moveably mounted on a rail 206. Movement of the imagers along the rail may be manual or may be motorized using a motor (not shown) attached to the bases 204 or by other means as known in the art. Alternatively or additionally, the rail is formed with detents 207, into which matching elements, such as for example, spring loaded elements, fit to removably position the base at one of a number of fixed positions. Additionally or alternatively, an encoder 208 may be used to determine the position of the base (and thus the imager) along the rail. Encoder 208 may be an optical encoder that determines the position based on a reading of markings 210 on rail 206. Alternatively, it may be a mechanical encoder that measures the movement of the base along the rail. Any other type of encoder or other positioning method or method of measuring position, as known in the art may be used. Alternatively, the imagers are fixed in place. Alternatively, as described below, a single camera may be used. Alternatively, more than two imagers may be used. Alternatively, cameras 202 may be fixed in place and folding mirrors (not shown) may be moveable along rail 206. It is noted that for the various imager configurations, arrangements may need to be provided to enable suitable movement of imagers 202 for adjustment of focusing.

Imagers 202 are placed in positions such that they view one or more features 151 are generated by the scanner. The image(s) of the feature(s) is analyzed by an image analyzer 209 (which may be a properly programmed computer or other device known in the art) to determine the position of the feature in the coordinate system defined by the field of view of the imagers. These positions are fed to a computational system 212, which may be a general or special purpose computer or other circuitry. The computational system is referred to herein, for simplicity, as "computer 212". Computer 212 also receives an indication of the relative position of the imagers on the rail (when the imagers are not fixed). This indication may be sent to the computer by encoders 208, or, especially where manual movement and detents are used to position the imager, may be inputted manually to the computer.

Computer 212 also generally includes information regarding the relationship between the imager coordinate system and the scanner coordinate system (shown in FIG. 4 as being in an image-scanner transform memory 211), such that the measured position of the features in the imager coordinate system can be translated into the scanner coordinate system. In general, it is desirable (but may not be essential in all cases) to determine a transformation between the coordinate systems.

Figure 5A:
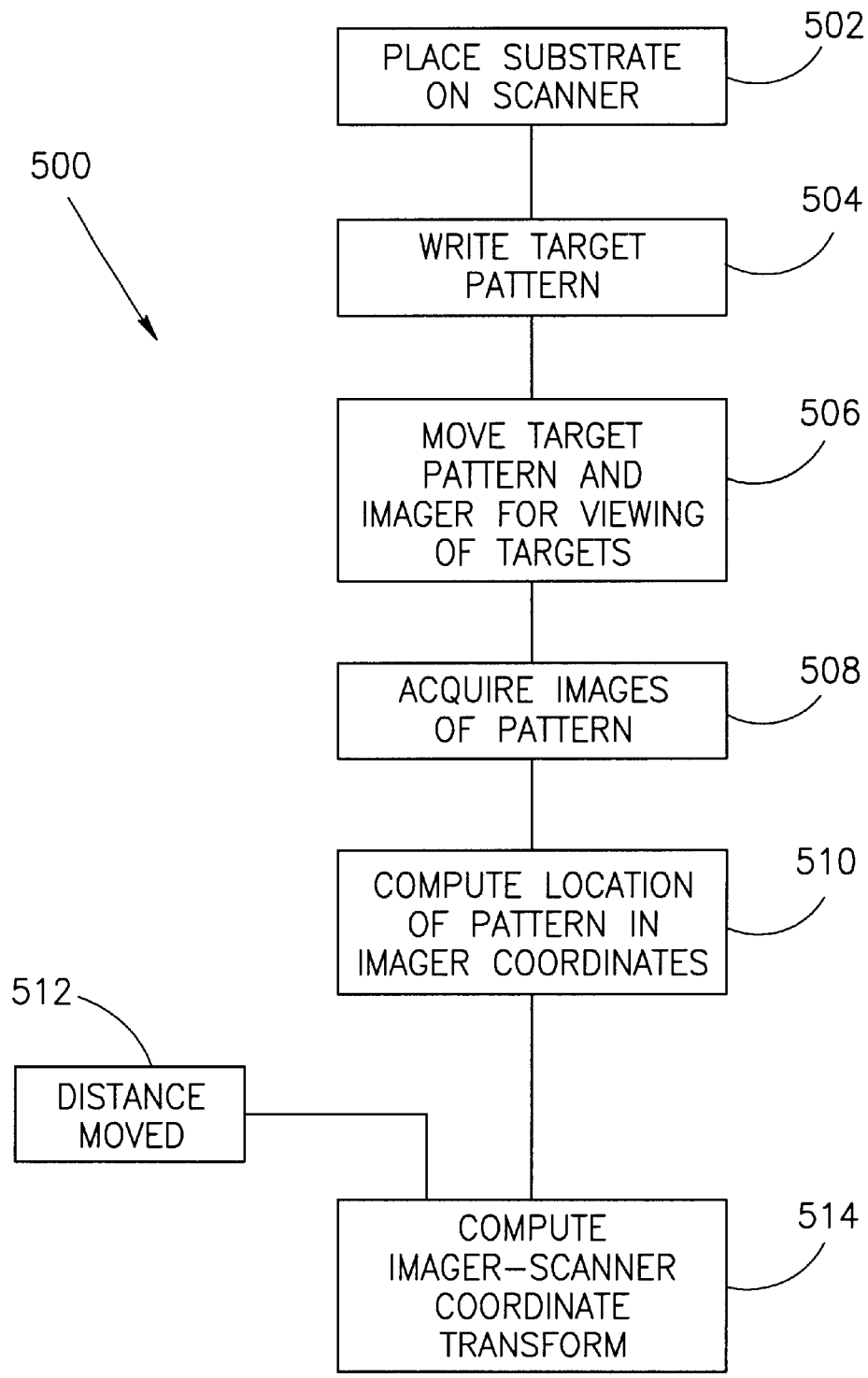
FIG. 5A is a simplified flow diagram of a method of determining an imager-scanner transform in accordance with an embodiment of the invention.
Figure 7:
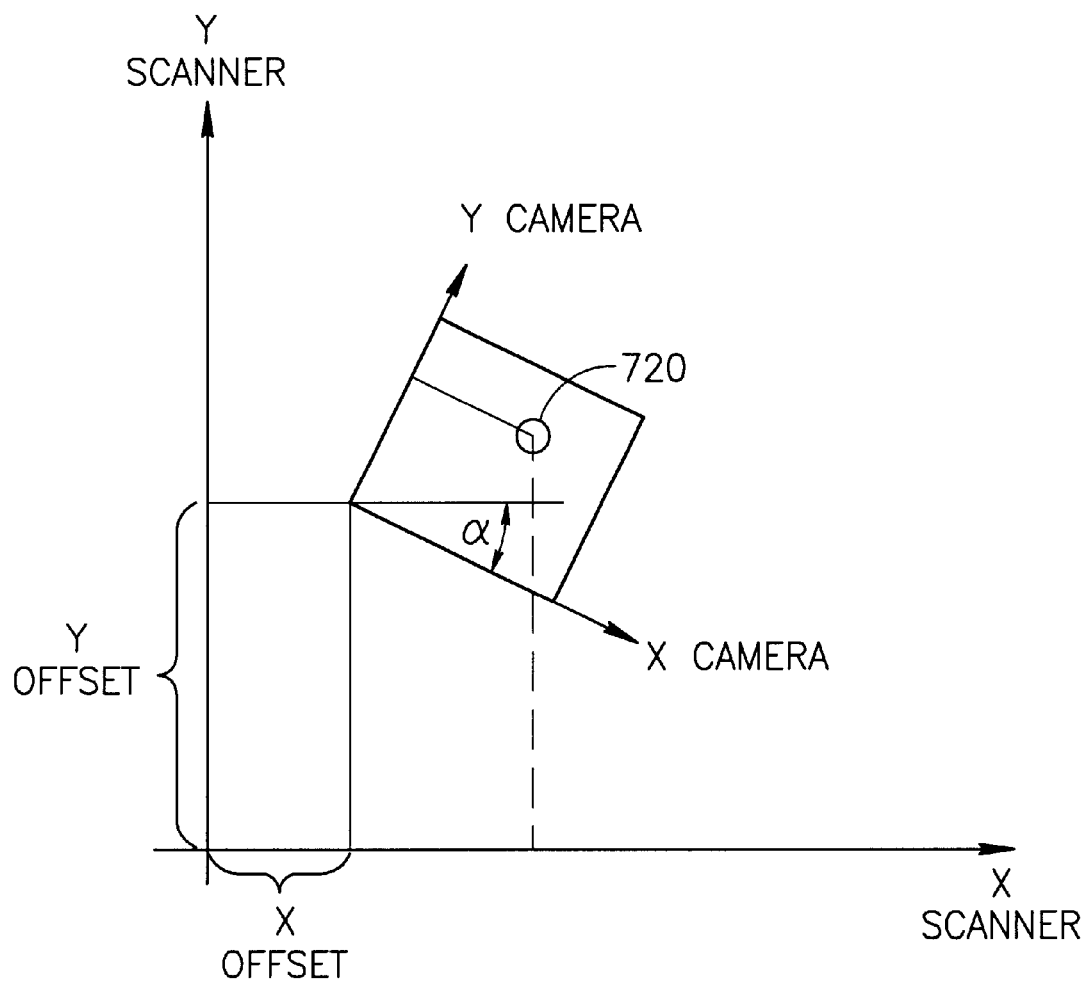
FIG. 7 is a simplified diagram showing calibration transformations between imager coordinate space and scanner coordinate space.

Reference is made to FIG. 7 which is a diagram illustrating calibration transformations that are performed in exemplary embodiments of the invention. Calibration between the imager coordinate system and the scanner coordinate system should account for mutual X, Y translation of a point 720 in imager coordinate space and scanner coordinate space respectively, angular alignment of an imager coordinate space relative to scanner coordinate space, and the size of a pixel in imager coordinate space compared to the size of a pixel written by the scanner FIG. 5A is a flow diagram of an exemplary method 500 of determining the translation of the coordinate systems in a calibration stage typically performed prior to scanning a batch of printed circuit board substrates.

First (502) a bare photosensitized substrate 78 is placed on the scanner. For the purposes of calibration, no particular orientation of the substrate is necessary, provided that a pattern, or patterns, may be written on the substrate, and that substrate 78 is held in a fixed orientation to a stage 79 (FIG. 3) during writing and subsequent imaging by imagers 202.

Next, a "target" pattern 151 is written (504) on the sensitized substrate. In one embodiment of the invention, the sensitized material is of a type that produces a visible "latent" image even without development or etching when exposed to the (generally, but not always, UV) light used to write the pattern on the sensitized substrate. A suitable substrate for use in the calibration process which forms a visible "latent" image when exposed to UV light of a scanner system is Dulux Registration Master photosensitive sheets available from DuPont. In exemplary embodiments of the invention, the target pattern or patterns for calibration are written onto the photosensitive substrate such that they can be viewed from one or more positions at which the imager can be placed, and in particular, at positions at or near where the imagers are placed to view alignment patterns written on the substrate during scanning. The pattern is written on a portion of the substrate that is located under the scanning line 213 shown in FIG. 4. Optionally an array of alignment patterns is written and the patterns in the array are viewed sequentially.

A plurality of alignment patterns 151 is optionally written at various imager positions such that these patterns can be imaged by one or more imagers 202.

Then the scanner moves the substrate (506) such that the patterns are in a position for viewing by the imager(s). The imagers are placed in position (when they have to be used) so that they sequentially view each of the patterns 151, and a the locations of each pattern 151 is stored in image-scanner transform memory 211. As is well known and shown in FIGS. 1 and 2, scanners are provided with very accurate means for measuring the movement of the substrate in the cross-scan direction.

The imagers acquire images of the patterns (508) and pass them to analyzer 209, which may be, in a practical situation hardware and software associated with computer 212.

Analyzer 209 computes a reference location of each pattern, for example a center point, a corner point, or some other reference point in the pattern, with respect to the particular imager coordinates and passes the information to computer 212.

Computer 212 calculates (510) the position, orientation and scaling of the patterns in the imager coordinate system. This calculation may be determined, for example, by determining the position of the pattern in the imager system and then transforming this position by the measured movement of the substrate. It may be helpful to calibrate the imagers against each other by having them view the same pattern, without moving the pattern. To do this, the imagers are sequentially positioned to view the pattern (for example using the same detent for more than one imager). The positions (and optionally the orientations) of the images is used to determine a transformation which corrects for the differing placements of the imagers on their respective bases.

Computer 212 also receives information as to the distance moved by the substrate during the movement (512), as described above.

Computer 212 computes a transform (514) between the coordinate systems of each imager and of the scanner respectively. This transform is based on the known positions at which a calibration pattern was written in the scanner coordinate system, the distance the board traveled and the position of the pattern in the imager coordinate system. This transformation may be stored in memory locations in computer 212, which may be a general purpose computer or a special purpose computer.

This transform (including information relating the coordinate systems of the various imagers in the various positions to the overall imager coordinate system) is stored, for example in image scanner transform memory 211, for use by the computer.

The patterns 151 may be a simple cross-hair pattern or they may be a more complex pattern. Alternatively, the pattern may comprise a series of crosses or dots.

Figure 6:
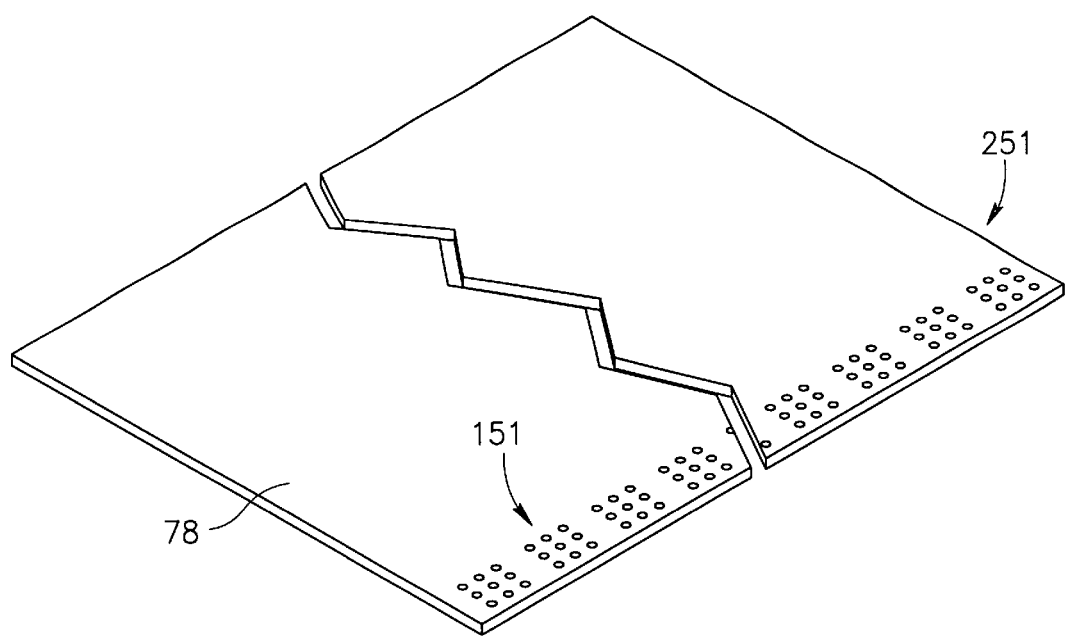
FIG. 6 shows a perspective drawing of an array of calibration and/or alignment patterns written on a substrate.

Reference is now made to FIGS. 6 which illustrates an array 251 of exemplary patterns 151 employed to calibrate X, Y translation between the imager coordinate space and scanner coordinate space. As seen in FIG. 6, array 251 comprises a plurality two dimensional patterns 151 generally extending the length of an edge of substrate 78, wherein each pattern 151 is formed of a 3×3 matrix of equidistant dots. As seen in the exemplary pattern appearing in FIG. 6 a suitable pattern comprises a 2-dimensional 3×3 array of 0.08" diameter dots mutually spaced apart by 0.1". Other suitable arrays of patterns, including suitably sized dots and distances between dots may be used. These patterns, when written by a scanner system, allow for the determination of X and Y translation distances, precise determination of a center point of the pattern for calibration of a transform, and an angular orientation of an imager in space relative to the scanner so as to enable compensation for angular offset, distortion, and differences in magnification between extremities of an image acquired by the imager, and coordination of camera pixel size to scanner pixel size.

It is noted that when an array 252 of patterns 151 is used, the position for each pattern is determined and its respective translation is stored in a data base thus correlating position translation of imager for a series of locations. Moreover, the calculation may be based on movement of the substrate, location of an imager 202 with respect to each pattern 151 in array 251 and the location of the reference point in each of images 151 in the field of view of an imager 202.

The calibration described with respect to FIG. 5A may be repeated as desired to assure that there is no change in the transformation. It could even be performed on each PCB, although this is seldom necessary. However, since the method requires writing of a particular calibration pattern each time, it is also possible to perform a simplified check on the transformation, as described with reference to FIG. 5B, which shows a method 530 which may result in a correction to the basic alignment achieved by the method of FIG. 5A. In accordance with some embodiments of the invention a jig 161, comprising a through hole 163, attached to base 79 is provided to facilitate coordinate space alignment.

Figure 5B:
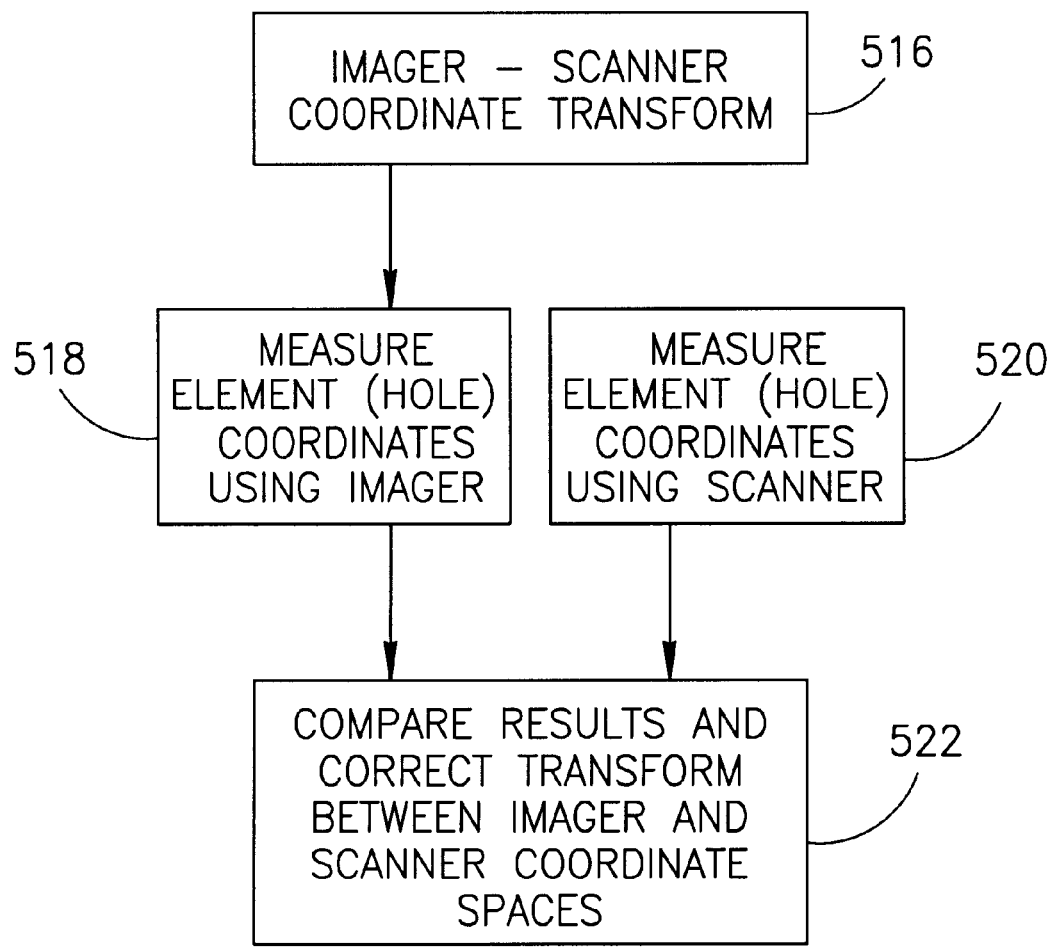
FIG. 5B is a simplified flow diagram of a method of calculating offset corrections between imagers and scanner prior to imaging a circuit pattern.

As seen in the flow chart of FIG. 5B, image scanner coordinate transform data, for example, as derived using the method of FIG. 5A, is received (516). The location of hole 163 is determined using an imager (518) and transformed to scanner coordinates using the transform. The location of hole 163 is also determined using beam 16 (520). A suitable method for determining the location of hole 163 using beam 163 is described in PCT patent publication WO 00/02424 and with respect to FIG. 2 above. Beam 16 is scanned over hole 163, and a collector 152 is provided underneath base 79 to collect light inputs as beam scans the hole. On-off modulation, as the beam passes the hole, of the signal from the light collector enables precise determination of the location of edges of hole 163, and precise determination of the location of the center of hole 163 therefrom. The location of hole 163 as determined by an imager 202 and corrected by the imager scanner coordinate transform, and the hole location determined using beam 16 are compared (522) and aligned to ensure precise correlation between imager coordinate space and scanner coordinate space for each scan. The alignment factor is stored in computer 212.

Figure 5C:
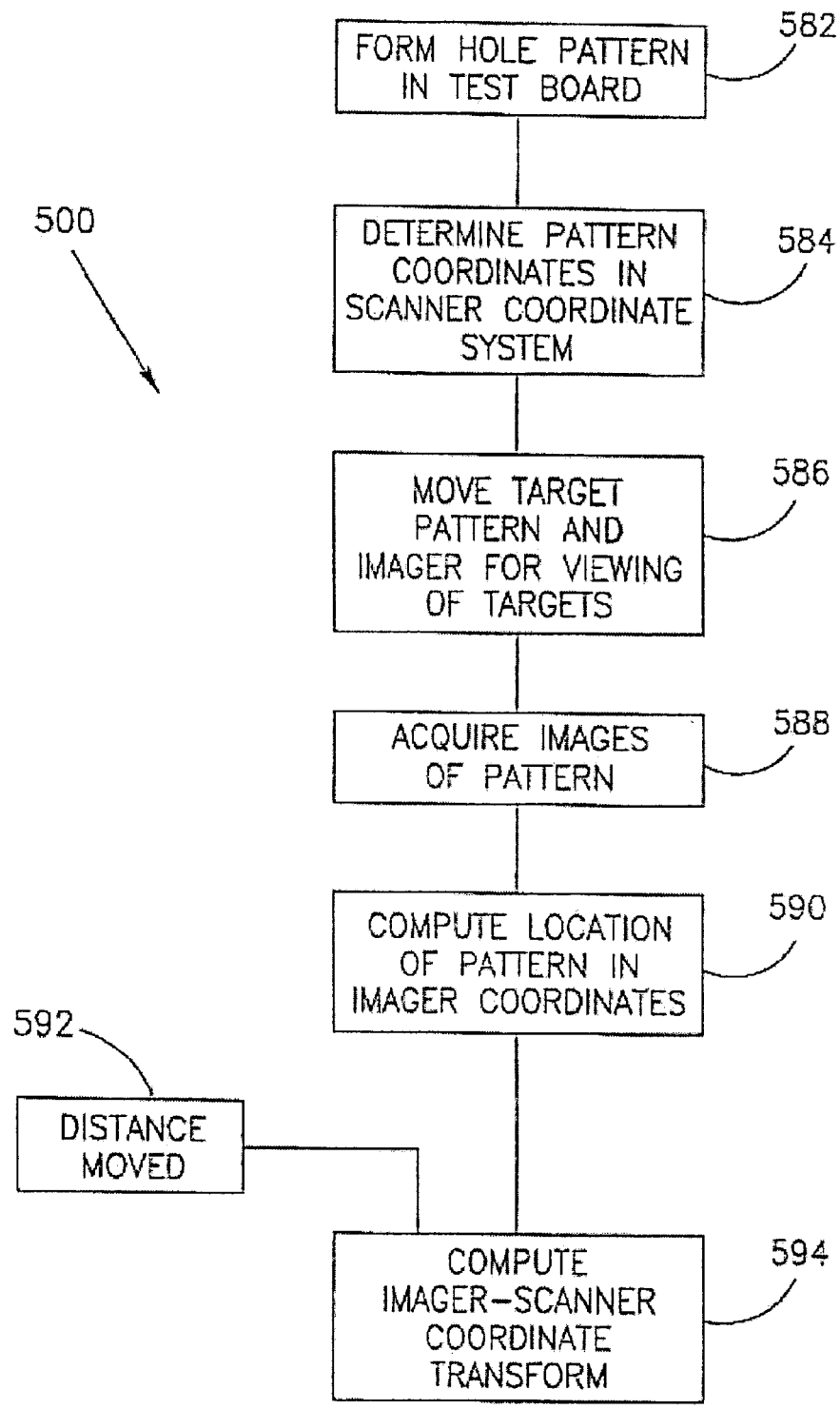
FIG. 5C is a simplified flow diagram of an alternative method of determining an imager-scanner transform in accordance with an embodiment of the invention.

FIG. 5C shows another method (580) for determining a transform between the imager and scanner coordinate systems. In this method a series of patterns of holes, such as those shown in FIG. 6 is formed in a calibration board (582). Alternatively, simpler patterns may be formed.

The coordinates of the pattern are determined in scanner space using the method described in PCT patent publication WO 00/02424 and with respect to FIGS. 2 and 5B above (584). The board is then moved (586), together with the table, the accurate table-motion measuring system built in to the scanner.

The imagers acquire images of the patterns (588) and pass them to analyzer 209, which may be, in a practical situation hardware and software associated with computer 212.

Analyzer 209 computes (590) a reference location of each pattern, for example a center point, a corner point, or some other reference point in the pattern, with respect to the particular imager coordinates and passes the information to computer 212.

Computer 212 calculates (590) the position, orientation and scaling of the patterns in the imager coordinate system. This calculation may be determined, for example, by determining the position of the pattern in the imager system and then transforming this position by the measured movement of the substrate. It may be helpful to calibrate the imagers against each other by having them view the same pattern, without moving the pattern. To do this, the imagers are sequentially positioned to view the pattern (for example using the same detent for more than one imager). The positions (and optionally the orientations) of the images is used to determine a transformation which corrects for the differing placements of the imagers on their respective bases.

While this system does allow for the determination of an accurate transform, it does require the production of a special printed circuit board jig and the provision of a table with holes and a detector such as detector 152, 153 shown in FIG. 2.

Computer 212 also receives information as to the distance moved by the substrate during the movement (892), as described above.

Computer 212 computes a transform (894) between the coordinate systems of each imager and of the scanner respectively. This transform is based on the known positions at which a calibration pattern was written in the scanner coordinate system, the distance the board traveled and the position of the pattern in the imager coordinate system. This transformation may be stored in memory locations in computer 212, which may be a general purpose computer or a special purpose computer.

This transform (including information relating the coordinate systems of the various imagers in the various positions to the overall imager coordinate system) is stored, for example in image scanner transform memory 211, for use by the computer.

In some embodiments of the invention greater accuracy in determining the transform and greater accuracy in determining the position of alignment patterns can be achieved by calibrating the field of view of the imager itself. A method 600 of performing such calibration is shown schematically in the flow chart of FIG. 8. In some embodiments of the invention, calibration of the field of view of the imager is performed as a single step along with determination of the translation of the coordinate systems.

A calibration pattern is provided (602) for viewing by the imager. In an embodiment of the invention, an accurate pattern, for example an array of precisely sized and positioned dots appearing as a pattern 151 in FIG. 6, is scanned onto or formed in a substrate by scanner system 10. In some exemplary embodiments, it is sufficient to use a single pattern 151 for the purpose of field of calibration, although improved results may be obtained by using multiple patterns 151. The patterns and imagers are moved to enable viewing of the patterns by respective imagers and images of the calibration patterns is acquired (604). The locations of the pattern elements in the coordinate system of the imager is determined (606) by image analyzer 209 or computer 212 and compared (608) to the actual relative positions of the elements on the pattern. Due to variations in the magnification of the image pattern as seen by the imager, distortion, angular orientation of the imager in space not in alignment with respect to the scanner, and aberrations in the imager optics, the position and size of the elements on the image (in the coordinates of the particular imager) may not precisely correspond to those of the actual pattern. Analysis of the image enables physical adjustment of the imager to partially align the imager relative to the scanner. Additionally, computer 212 computes a calibration transformation (610) to transform imager coordinate position with the actual position in the field of view of the imager to calibrate pixel size of pixels in the imager to the pixel size of pixels written by the scanner and to correct for any remaining, magnification errors, distortions or other image aberrations. It should be understood that the actual position of the pattern is not critical since it is the relative positions, spacings and/or size of the elements of pattern in the field of view of the imager that is used to calibrate the field of view of an imager. This transformation is used in all measurements made with the imager, as for example, the measurements of position of a pattern as in the method of FIG. 5 or in the position of an alignment pattern in a substrate. The corrections for pixel size may be a single value as a function globally correcting for all pixels, or a function taking into account magnification errors, distortions and aberrations that are not uniform over the entire field of view of an imager 202.

It should be understood that the methods of FIGS. 5 and 8 can be performed in essentially a single operation by writing a pattern on a sensitized substrate that can be used for both determining a coordinate transformation between the imager and scanner systems and an internal calibration of the field of view of the imagers. For example, if a pattern comprising an array of equally spaced elements (such as dots or cross-hairs having different extent from the central one) is written on the board, a center point of the array can be calculated and used to determine the coordinate transform between the imager system and the scanner system. Alternatively, a cross hairs indicating a particular reference point along with additional elements may be provided. Either way, the plurality of elements can be used to calibrate the field of view of the imager itself and calibrate the coordinate space of the field of view of the imager to correspond to the coordinate spaced of the scanner.

The transform may be stored in image analyzer 209 and may be used to correct images received from imagers 202 before any processing is performed on or using them.

The invention has been described utilizing exemplary apparatus and exemplary methods. It should be understood that other apparatus may be used in carrying out the methods and the methods described may be useful in apparatus that is different from that described. Furthermore, since each of the methods is, in great measure, a stand alone method, other methods may be utilized in determining one or more of the calibrations described. In particular, it may be possible, under certain circumstances, to delete or simplify one of the calibrations, as for example when the devices are produced to a very high tolerance or where very high accuracy is not needed. In addition, while a system using two imagers has been described, a single imager view to encompass multiple patterns on the substrate. Generally, this embodiment will have a lower resolution and accuracy, but may be useful for some applications. A second method is to move the imager from position to position to image different patterns.

While the methods and apparatus described represent a "best mode' for carrying out the invention, it should be understood that some elements of the apparatus and claims may not be necessary for all embodiments of the invention and that elements of the various embodiments may be combined.

As used herein, the terms "have", "include" and "comprise" or their conjugates, as used herein mean "including but not necessarily limited to".

What is claimed is:

1. A method of calibrating a camera used in a scanner for scanning images onto printed circuit board substrates, the method comprising:
   (a) writing a pattern onto a photosensitized substrate using the scanner to expose the photosensitized substrate with modulated light, wherein the pattern is visible without development;
   (b) imaging the pattern with at least one imager; and
   (c) determining a transformation between an imager referenced coordinate system and a scanner referenced coordinate system in response to the image of the pattern.

2. A method according to claim 1 and including moving the pattern between (a) and (b) without removing the substrate from the scanner.

3. A method according to claim 2 and including measuring the amount of said movement and utilizing said measurement in said determination of the transformation.

4. A method according to claim 1 wherein the at least one imager comprises a single imager.

5. A method according claim 1 wherein the at least one imager comprises a plurality of imagers.

6. A method according to claim 1 wherein the at least one imager is fixed in position.

7. A method according to claim 1 wherein the at least one imager is moveable, and including a measurement assembly for determining the position of the at least one imager.

8. A method according to claim 1 wherein the pattern comprises a two dimensional pattern and including calibrating the field of view of the imager based on an image of the pattern acquired by the imager.

9. A method according to claim 8 wherein calibrating includes adjusting the spatial orientation of the imager with respect to the scanner.

10. A method according to claim 8 wherein calibrating includes compensating for differences in magnification at various parts of the field of view of the imager.

11. A method according to claim 8 wherein calibrating includes compensating for distortion in the field of view of the imager.

12. A method according to claim 1 wherein determining a transformation includes determining coordinates of the pattern in imager space.

13. A method according to claim 12 wherein the pattern comprises a two dimensional pattern.

14. A method of correcting alignment between a scanner portion of a direct writing scanner and an imager thereof, the method comprising:
   (a) providing a transformation between a scanner coordinate system and an imager coordinate system, utilizing the method of claim 1;
   (b) providing an object whose location is measurable in both the scanner coordinate system and in the imager coordinate system;
   (c) measuring the location of the object in the scanner coordinate system;
   (d) measuring the location of the object in the imager coordinate system; and
   (e) correcting the transformation based on the measured locations in the two coordinate systems.

15. A method according to claim 14 wherein correcting comprises:
   transforming the measured location in a first one of the coordinate systems to the other coordinate system;
   determining a difference between the location of the object as measured in the other coordinate system and the location of the object measured in the first coordinate system and transformed into the other coordinate system; and
   correcting the transformation responsive to said difference.

16. A method according to claim 15 wherein the object is a circularly symmetrical object.

17. A method according to claim 1 and further comprising:

(d) employing said transformation during the scanning of an electrical circuit pattern onto a printed circuit board substrate to correct the position of the scanned image.

18. A method of calibrating a camera used in a scanner for scanning images onto printed circuit board substrates, the method comprising:

(a) optically recording a pattern that is visible on a photosensitized substrate without development;

(b) determining the coordinates of the pattern in a scanner coordinate system;

(c) imaging the pattern with at least one imager; and (d) determining a transformation between an imager referenced coordinate system and a scanner referenced coordinate system, responsive to the determined coordinates and the images of the pattern.

19. A method according to claim 18 and including moving the pattern between (a) and (c) without removing the substrate from the scanner.

20. A method according to claim 19 and including measuring the amount of said movement and utilizing said measurement in said determination of the transformation.

21. A method according to claim 18 wherein the at least one imager comprises a single imager.

22. A method according claim 18 wherein the at least one imager comprises a plurality of imagers.

23. A method according to claim 18 wherein the at least one imager is fixed in position.

24. A method according to claim 18 wherein the at least one imager is moveable, and including a measurement assembly for determining the position of the at least one imager.

25. A method according to claim 18 wherein the pattern comprises a two dimensional pattern and including calibrating the field of view of the imager based on an image of the pattern acquired by the imager.

26. A method according to claim 25 wherein calibrating includes adjusting the spatial orientation of the imager with respect to the scanner.

27. A method according to claim 25 wherein calibrating includes compensating for differences in magnification at various parts of the field of view of the imager.

28. A method according to claim 18 wherein determining a transformation includes determining coordinates of the pattern in imager space.

29. A method according to claim 18 wherein optically recording a pattern includes optically recording a pattern of crosses or dots, and comprising:

determining correction factors for locations in the camera field of view of the camera, responsive to the image.

30. A method according to claim 29 wherein the pattern of crosses or dots comprises a two dimensional pattern.

31. A method according to claim 29 and further comprising adjusting the spatial orientation of the imager with respect to the scanner.

32. A method according to claim 29 and further comprising compensating for distortion in the field of view of the imager.

33. A method according to claim 18 and further comprising:

(e) employing said transformation during the scanning of an electrical circuit pattern onto a printed circuit board substrate to correct the position of the scanned image.

34. A method of correcting alignment between a scanner portion of a direct writing scanner and an imager thereof, the method comprising:

(a) providing a transformation between a scanner coordinate system and an imager coordinate system, utilizing the method of claim 18;

(b) providing an object whose location is measurable in both the scanner coordinate system and in the imager coordinate system;

(c) measuring the location of the object in the scanner coordinate system;

(d) measuring the location of the object in the imager coordinate system; and (e) correcting the transformation based on the measured locations in the two coordinate systems.

35. A method according to claim 34 wherein correcting comprises:

transforming the measured location in a first one of the coordinate systems to the other coordinate system;

determining a difference between the location of the object as measured in the other coordinate system and the location of the object measured in the first coordinate system and transformed into the other coordinate system; and correcting the transformation responsive to said difference.

36. A method according to claim 35 wherein the object is a circularly symmetrical object.

37. A method for fabricating electrical circuits, comprising:

calibrating a camera used in a direct imaging scanner, said calibrating comprising:

(a) utilizing said direct imaging scanner to provide modulated light to record a pattern on a photosensitized substrate, said pattern being visible without development;

(b) imaging the pattern with at least one imager; and (c) determining a transformation between an imager referenced coordinate system and a scanner referenced coordinate system in response to the image of the pattern;

receiving from an imagers an image of a reference located on an in-fabrication electrical circuit;

employing said transformation to correct said image of said reference; and processing said in-fabrication electrical circuit using said corrected image.

\* \* \* \* \*